THIN FILM PIEZOELECTRIC OSCILLATOR

Filed July 24, 1967 Sheet 1 of 2

INVENTORS
ARMAND R. POIRIER
TERRY F. NEWKIRK
BY Philip D. Amins
ATTORNEY

INVENTORS
ARMAND R. POIRIER
TERRY F. NEWKIRK
BY Philip D. Amins
ATTORNEY

United States Patent Office 3,422,371
Patented Jan. 14, 1969

3,422,371
THIN FILM PIEZOELECTRIC OSCILLATOR

Armand R. Poirier, Nashua, N.H., and Terry F. Newkirk, Lynnfield, Mass., assignors to Sanders Associates, Inc., Nashua, N.H., a corporation of Delaware Filed July 24, 1967, Ser. No. 655,461
U.S. Cl. 331—107 13 Claims
Int. Cl. H03b 5/36; H03b 7/06; H03b 5/32

ABSTRACT OF THE DISCLOSURE

A resonant device is provided by an epitaxial film of semiconductor material having substantial piezoelectric qualities bounded on opposite sides by interfaces with other materials or environment such that high frequency acoustic waves generated within the film by electric fields applied thereto experience sufficient reflection at the interfaces to resonate therebetween at an acoustic wave frequency determined by the thickness of said film and so the device exhibits electrical resonance.

The invention herein described was made in the course of a contract with the Department of the Navy.

This invention relates to piezoelectric semiconductor devices and more particularly to a thin film piezoelectric semiconductor device which is acoustically resonant.

Heretofore, piezoelectric crystals have been employed as passive resonators in conjunction with a driving circuit to provide a highly stable oscillator. Piezoelectric crystals such as quartz produce a highly stable electromechanical resonance up to about 150 mHz. They are usually employed in conjunction with a driving amplifier and provide positive feedback to the amplifier at the resonant frequency of the crystal so that the combination performs as an oscillator to generate the resonant frequency. Since the resonant frequency is dependent on the thickness of the piezoelectric crystal, the upper frequency limit of such an oscillator is limited by the smallest size that the crystal can be accurately cut. Consequently the generation of frequencies higher than 150 mMz. is generally accomplished with other devices such as klystrons or other vacuum tube devices.

It is one object of the present invention to provide a device exhibiting substantial electro-mechanical resonance at high frequencies in the range of 150 mHz. or greater.

Semiconductors which are crystalline materials, can be grown in very thin layers generally called epitaxial layers which may be only a few microns thick. Some single crystal semiconductors exhibit significant piezoelectric effect under appropriate conditions. These include ZnO, CdS, AlN, InAs, CdSe, CdTe, GaAs, GaP, ZnS and some others.

Some of these semiconductor materials (particularly CdS) are currently used quite effectively as transducer for converting high frequency electrical waves into material or acoustic waves which are launched into a delay line. This work has led to multilayer thin film piezoelectric transducers. The transducer is made in a thin film deposited on the end of the delay line along with other thin films in an effort to match the acoustic characteristic impedance of the piezoelectric film in which the acoustic waves are generated, to the impedance of the delay line. Some efforts in the respect are described in an article by John de Klerk entitled "MultiLayer Thin Film Piezoelectric Transducers," in IEEE Transactions on Sonics and Ultrasonics; August, 1966, vol. SU 13, No. 3, p. 99.

It is a characteristic of piezoelectric semiconductor materials that an acoustic wave propagating through the material generates a piezoelectric field which interacts and exchanges energy with mobile charge carriers driven through the medium by an external DC electric field. The acoustic wave travelling through the piezoelectric semiconductor medium generates an alternating electric field which travels at the same velocity as the acoustic wave. When a DC voltage is applied to the medium, it creates a direct current, whereupon the alternating field tends to bunch the mobile charges in the material, increasing the local electric field which reacts upon the piezoelectric medium to produce additional acoustic wave components. The action is somewhat analagous to the interaction and exchange of energy between an electron beam and RF wave fields in a travelling wave amplifier tube. Some of the features of an amplifier which makes use of this phenomenon are described in U.S. Patent 3,173,100, entitled "Ultra-Sonic Wave Amplifier," which issued to D. L. White, Mar. 9, 1965.

It is another object of the present invention to provide a solid state oscillator for producing frequencies substantially higher than 150 mHz.

It is still another object of the present invention to form said solid state oscillator of thin films so that the physical dimensions of the oscillator may be very small.

One embodiment of the present invention is an electromechanical resonator comprising a thin film of suitable piezoelectric semiconductor material sandwiched between acoustic wave reflecting interfaces defining an acoustic cavity resonant at a prescribed acoustic wave frequency. Electric and acoustic waves travelling parallel in this cavity exchange energy as described above and so the resonator, in effect, is resonant to the electric waves. This device has the advantage of very small dimensions relative to prior resonant devices, because it is the acoustic wavelength that dictates the dimensions of the device.

A plurality of such resonators can be cascaded to form a filter in which the acoustic waves travel from one resonator to another through interfaces between the resonators that transmit part of the acoustic wave energy incident thereon. Thus, an electrical input signal applied to the one resonator will produce a corresponding filtered electrical signal at the other resonator.

Another embodiment of the present invention incorporates the above described phenomenon for amplifying an acoustic wave in a piezoelectric semiconductor medium to provide an oscillator of very small dimensions. More particularly, a DC electric field imposed on a thin film of suitable piezoelectric semiconductor material causes acoustic waves travelling in one direction in the material to be amplified just as described in the above mentioned Patent 3,173,100. In this embodiment, the thickness of the semiconductor in the direction of the electric field is an integral number of half wavelengths of the acoustic wave and the parallel surfaces of the semiconductor which define this dimension forms interfaces with materials selected to produce substantial or total acoustic reflection at the interface. As a result, the interfaces define a resonant acoustic caivty enclosing the piezoelectric semiconductor material. In operation, an acoustic wave travelling through the semiconductor in the direction of the electric field (transverse to the interfaces) is amplified when the charge drift velocity produced by the external DC field is in the same direction and greater than the acoustic wave velocity. Thus, the acoustic wave is amplified in one direction through the semiconductor from one interface to the other and since the interfaces define a resonant acoustic cavity, the amplified acoustic wave is fed back in phase for reamplification, and so the wave is sustained just as in a classical oscillator composed of an amplifier and sufficient positive feedback to overcome losses.

Embodiments of the present invention described herein include a thin film of suitable piezoelectric semiconductor material of thickness which is an integral number of half wavelengths of the acoustic wave. This thin film of semiconductor is laid down on a plurality of other thin films, each of thickness equal to an odd number of quarter wavelengths of the acoustic wave. At least one of these additional layers is electrically conductive and serves to bound the DC or AC electrical field imposed on the piezoelectric semiconductor layer. In addition, the acoustic characteristic impedance of these additional layers are alternately relatively high and relatively low, so that they combine to reflect very nearly all the acoustic wave energy generated in the piezoelectric semiconductor back into the piezoelectric semiconductor in the proper phase with resonant acoustic waves therein. Consequently, the Q of the acoustic cavity defined between the interfaces of the piezoelectric semiconductor is sufficiently high that the device subjected to a DC electric field, operates as an oscillator. The upper surface of the piezoelectric semiconductor is coated with a very thin film of conductive material which serves to bound the DC electric field. The medium adjacent this is preferably, but by no means always, a gas such as air, hydrogen, nitrogen, etc. which has an extremely low acoustic characteristic impedance and will reflect close to 100% of the acoustical energy incident on the interface.

Other features and objects of the present invention will be apparent from the following specific description taken in conjunction with the figures in which.

Figures 1, 3:
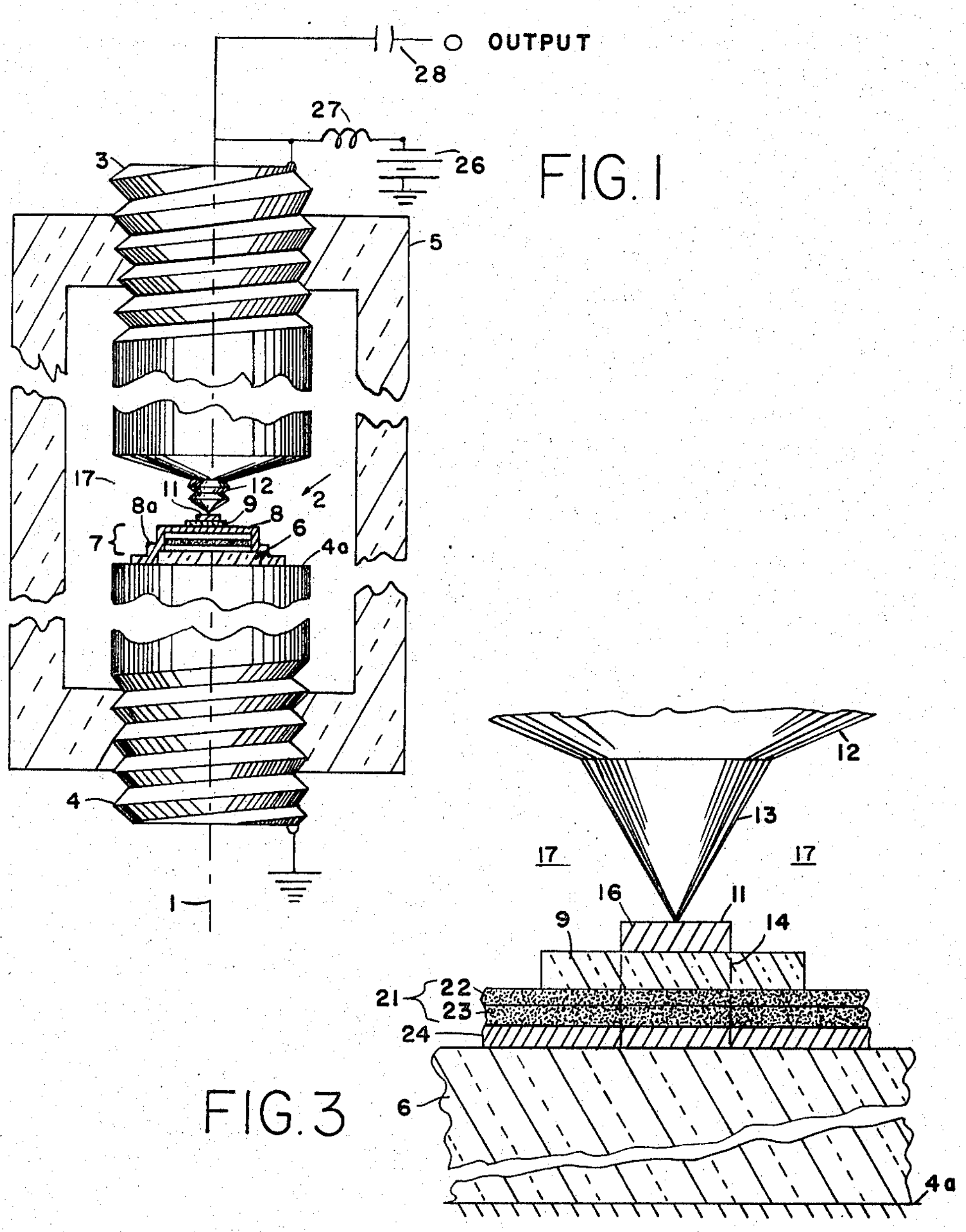
FIGURE 1 illustrates a partially sectioned view of the thin film piezoelectric semiconductor oscillator.
FIGURE 3 is a similar view showing another orientation of the thin films.

Oriented thin films of CdS can be fabricated using certain vacuum deposition techniques. One technique for depositing a thin film of CdS is to direct separate beams of cadmium and sulphur toward a substrate upon which the film is deposited. The process consists of evaporating cadmium and sulphur from separate molybdenum crucibles. The crucibles are heated by resistance heating with a tungsten wire and the temperature of each is monitored with a thermocouple. Each crucible is capped with a molybdenum lid having a hole in it. The evaporated cadmium and sulphur molecules are directed up through the hole, through a cold trap to the substrate upon which the film is deposited. The cold trap serves to trap molecules which are not initially deposited on the substrate. Typical temperatures as monitored by thermocouples are 180° C. for the substrate, 270° C. for the cadmium, 130° C. for the sulphur. These temperatures will produce a deposition rate of about .1 micron per minute.

The thickness of the film is measured with a laser beam directed perpendicular to the film. The reflected laser beam is detected, amplified and recorded as a function of time. A plot of this function is indicative of the interference pattern between the laser light reflected at the top and bottom interfaces of the film. Maximum intensity occurs when the CdS film is a multiple of one-half optical wavelengths thick.

Successful use of the above technique has been recorded by D. K. Winslow and H. J. Shaw, working at the Microwave Laboratory, W. W. Hanscom Laboratory of Physics, Stanford University, California and quite clearly the technique can be employed to deposit a precisely measured thin film of some of the other piezoelectric semiconductor materials mentioned above.

An acoustic wave travelling in the direction of the C axis of the hexagonal CdS crystal can be amplified by applying a DC drift potential of sufficient magnitude in the same direction. This DC field must be of sufficient magnitude to impart a drift velocity to mobile carriers in the semiconductor material and this drift velocity must be in the same direction and greater than the velocity of the acoustic wave. When these and other conditions are satisfied, the acoustic wave is amplified. Heretofore, CdS crystals of relatively large size (2 mm. long in the direction of the C axis) have been used in this manner to provide an amplifier. The above mentioned U.S. Patent 3,173,100 describes such an amplifier. The patent also suggests that the amplifier can be located in a resonant electro-magnetic wave cavity and will perform in conjunction with the cavity as an oscillator to generate high frequency electrical waves. The frequency is established by the resonance of the electro-magnetic cavity and it is suggested that such an oscillator can be designed to operate in the range from 200 mHz. to over 100 kmHz. depending upon the tuning of the electromagnetic wave cavity. Quite clearly, within this range of frequencies, the electro-magnetic wave cavity is of some size. At 200 mHz., such an electro-magnetic cavity will measure many centimeters in dimension and at 100 kmHz. it will measure many millimeters in dimension.

In the present invention, the piezoelectric semiconductor such as CdS is laid down in a thin film on a substrate which is designed to effectively reflect acoustic waves. The piezoelectric film thickness is equal to an integral number of half wavelengths of the acoustic wave energy which is to be generated in the piezoelectric film. The substrate includes an electrically conductive layer for bounding one end of a DC electrical field directed transverse to the plane of the film and parallel to the C axis of the film. A second conductive film is then laid down upon the piezoelectric semiconductor film and serves to bound the other end of the DC electric field. This second conductive film is of negligible thickness in terms of acoustic wavelength or is an integral number of quarter acoustic wavelengths in thickness. A gaseous interface at this second conductive film assures almost complete reflection of the acoustic waves back into the CdS film at this interface.

By this construction, there is formed within the thin film of piezoelectric semiconductor an amplifier for amplifying acoustic waves and a resonant acoustic cavity which is resonant at the frequency of the acoustic waves. Accordingly, it is only necessary to couple DC potentials to the electrically conductive layers of sufficient magnitude to produce the acoustic wave. The resonating acoustic waves provide positive feedback to the acoustic waves oscillating at the same frequently so that electric waves (RF) at this frequency are generated within the piezoelectric semiconductor film and can be coupled from the conductive films to a utilization device. One form of such a thin film piezoelectric semiconductor oscillator is illustrated in FIGURE 1.

When the DC (or AC) field is directed parallel to the C axis of the CdS film, the high-frequency acoustic waves are in the longitudinal mode and travel parallel to the field. When the DC (or AC) field is directed transverse to the C axis of the CdS film, the acoustic waves are in in the shear mode and travel parallel to the field. In the various embodiments of the present invention described herein, the acoustic waves travel transverse to the CdS film. Thus, the structures described herein can be made so that longitudinal or shear acoustic waves are generated by forming the epitaxial layer with the crystalline axis thereof in predetermined directions. Reference may be had to the prior art for methods and means for forming epitaxial films of various crystalline axis orientation of the suitable semiconductir materials mentioned herein.

Turning first to FIGURE 1, there is shown a very enlarged view of a thin film piezoelectric semiconductor oscillator incorporating features of the present invention. The structure is shown partly in cross section and may be a figure of revolution about the axis 1. The piezoelectric semiconductor film, the acoustically reflecting films upon which the piezoelectric film is laid down and the electrically conductive films for bounding the DC electric field applied to the piezoelectric semiconductor are all preferably laid down on a substrate chip or block or suitable material and the total thickness of the substrate and these films need not exceed one millimeter. This composite of a substrate and thin films is shown at the center of FIGURE 1 and denoted 2. It is held firmly in electrical contact with two threaded conductors 3 and 4, which are secured in an electro-magnetically transparent envelope 5.

The composite of substrate and thin films consists of the substrate 6 upon which is deposited a plurality of films 7, including at least one electrically conductive film 8, which makes direct electrical contact with the surface 4*a* of contact 4 to which the composite 2 is secured by, for example, laying down the film 8, so that it covers the layers 7 and extends to the surface 4*a*. Thus, the ends such as 8*a*, of conductive film 8 extend down along the side of the composite 2 to the surface 4*a*. The film of piezoelectric semiconductor material 9 is grown upon the conductive film 8 by, for example, employing the technique of Winslow and Shaw described above.

The plurality of films 7 including the electrically conductive film 8 are selected and are of the proper thickness so that they reflect nearly all the acoustic wave energy generated within the piezoelectric semiconductor film 9, back into the piezoelectric film. A number of different material combinations and film thicknesses will accomplish this and some are described below with reference to FIGURES 2 and 3.

Figure 2:
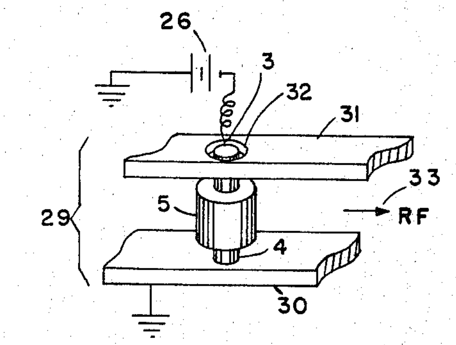
FIGURE 2 is an enlarged sectional view showing one orientation of the thin films.

Another electrically conductive film 11 is laid down upon the piezoelectric film 9 and serves, in conjunction with the conductive film 8, to bound the DC electrical field imposed on the piezoelectric film. Electrical contact is made to the film 11 by way of a noninductive gold-plated bellows 12. The bellows 12 has a point at its end which touches the film 11 as shown in FIGS. 2 and 3. The area of this upper film 11 defines the cross section area of an acoustic cavity 14 (shown by the dot-dash lines in FIGS. 2 and 3) which is coaxial with the axis 1. The lower acoustically reflecting boundary of this cavity is defined at the interface 15 between the multi-layer 19 and the substrate 6 and the upper boundary is defined at the interface 16 between the conductive film 11 and the gaseous or vacuum environment 17, or by the solid multi-layer environment between the conductive film 11 and the end of the bellows 13 within the transparent envelope 5. The interface 16 between the film 11 and environment 17 is highly reflective to acoustic energy generated within the piezoelectric semiconductor 9.

FIGURE 2 is a very enlarged sectional view of the composite structure 2 of FIG. 1 and reveals one arrangement of thin films 7 for producing the effect of substantial acoustic reflection within the acoustic cavity 14. In FIG. 2, the piezoelectric semiconductor film 9 has a thickness which is equal to an integral number of half wavelengths, $(n+1)\lambda/2$, of the acoustic wave energy that is to be generated therein. The piezoelectric film 9 is laid down upon the plurality of films 7 including the electrically conductive film 8, each of which is an odd integral number of quarter wavelengths, $(2n+1)\lambda/4$, of the acoustic wave. In these expressions, $n$ is any integral number or zero and $\lambda$ is the wavelength of an acoustic wave at the concerned frequency in the described film or material. For purposes of example, three such thin films are shown and denoted 8, 18, and 19. However, depending on the acoustic reflectivity desired, more or less may be required. These films are laid down on a substrate 6 of convenient structural thickness.

The acoustical characteristic impedance of the films 8, 9, 18 and 19 shown in FIG. 2 are selected so that a substantial amount of acoustic energy which crosses the interfaces therebetween will, by multiple reflection, throughout the films 8, 18 and 19 be returned to films 9 in phase with acoustic waves resonating therein. Accordingly, the films 8, 18 and 19 provide, in effect, a highly reflective interface 15 at the end of the cavity 14. This can be accomplished in a number of different ways only a few of which are described herein. For example, if the thickness of each of the films 8, 18 and 19 is an odd integral number of quarter wavelengths of the acoustic wave therein and, in addition, the acoustical characteristic impedances of these films are alternately high and low, then it can be shown that the above mentioned acoustical reflection quality desired at the interface 15 will be achieved. More particularly, it is preferred that the characteristic acoustic impedance of the conductive film 8 immediately adjacent the piezoelectric semiconductor film 9 be greater than the characteristic acoustic impedance of the piezoelectric semiconductor film. Furthermore, directly beneath the conductive film 8, the film 18 is preferably of lower characteristic impedance than the conductive film 8 and, thereafter the films below this alternately have high and low characteristic impedances. When materials are selected with the sutiable characteristic impedances and laid down in thicknesses which are substantially an odd number of quarter wavelength of the acoustic wave, then acoustic wave reinforcement within the piezoelectric semiconductor 9 will occur and the Q of the acoustical cavity 14 will be sufficiently high to sustain oscillations produced therein when voltages of suitable magnitude are applied to the conductive films 8 and 11.

The use of thin films to produce high reflection is somewhat analogous to the well-known optical dielectric mirror. Optical dielectric mirrors are formed by laying down a plurality of dielectric films on or between transparent media. These films are of alternately high and low refractive index and usually one quarter optical wavelength in thickness. For similar reasons, the films 8, 18 and 19 of alternately high and low characteristic acoustic impedance are each an odd number of quarter wavelengths of the acoustic wave in thickness.

An understanding of the relationship between acoustic wave reflection coefficients, acoustic wave transmission coefficients and the acoustic characteristic impedances of the materials may be had from the above mentioned article by John de Klerk entitled "Multi Layer Thin Film Piezoeletric Transducers."

Some of the combinations of materials that may be employed to form the films 8, 18 and 19 below a piezoelectric semiconductor of CdS include the following combinations:

Film 8 is Au, film 18 is $SiO_2$ and film 19 is $TiO_2$. If the above identified films are each formed of highly uniform thickness and are sufficiently free of impurities, then the first combination will oscillate and generate electric waves at about 3200 mHz. when the film thicknesses and crystalline axis transverse to the interfaces 15 and 16, are as follows:

| | Microns |
|---|---|
| Cds–C axis $(n+1)$ | 1.29 |
| Au $(2n+1)$ | .50 |
| $SiO_2$ (X cut) $(2n+1)$ | .83 |
| $Al_2O_3$ A axis $(2n+1)$ | 1.77 |

where $n$ is zero or any integral number.

Another form of the present invention is illustrated in FIGURE 3. Here the piezoelectric semiconductor film 9 is adjacent a plurality of films 21 (two are shown and denoted 22 and 23). These films are each an odd number of quarter wavelengths $(2n+1)\lambda/4$ of the acoustic wave in thickness and are laid down on an electrically conductive film 24 which is also an integral number of acoustic quarter wavelengths in thickness. In this embodiment, the thickness and quality of the multiple nonconductive layers 21 in conjunction with the piezoelectric layer 9 provide the acoustic reflection necessary to reinforce acoustic waves resonating in layer 9. In addition, the films 21 are sufficiently electrically conductive to conduct electrons from piezoelectric layer 9 to metal layer 24 and also provide capacitance necessary to match the impedance of a transmission line into which electrical energy from the acoustic oscillator is launched. This capacitance can also be varied by varying the area of the film 11.

Figure 4:
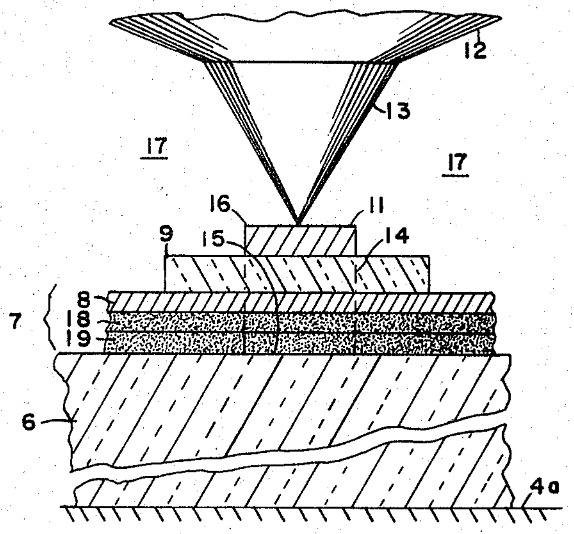
FIGURE 4 illustrates one technique for using the invention when embodied in the structure shown in FIGURE 1.

In operation, DC potentials are applied to the films 8 and 11 shown in FIGS. 1 and 2. This is accomplished by, for example, grounding the threaded conductor 4 and coupling the threaded conductor 3 to the negative terminal of battery 26 through inductive impedance 27 which blocks RF from the battery. The output high frequency electrical energy (RF) is obtained from an external capacitance 28 connected to the terminal 3. This capacitance merely serves to couple the high frequency energy from the oscillator and block the DC from the battery. FIGURE 4 illustrates the complete package of FIGURE 1 mounted between the conductors of a strip transmission line 29. The lower conductor 30 of the transmission line may be grounded and the terminal 4 connects directly to this. Terminal 3 couples capacitively with the other element 31 of the transmission line. For this purpose, the terminal 3 may extend into an opening 32 in the transmission line as shown, or any other sort of suitable capacitive coupling between this terminal and the element may be provided. The DC source 26 is connected directly to the terminal 3 and when energized RF energy 33 is launched into the transmission line for a useful purpose.

Figure 5:
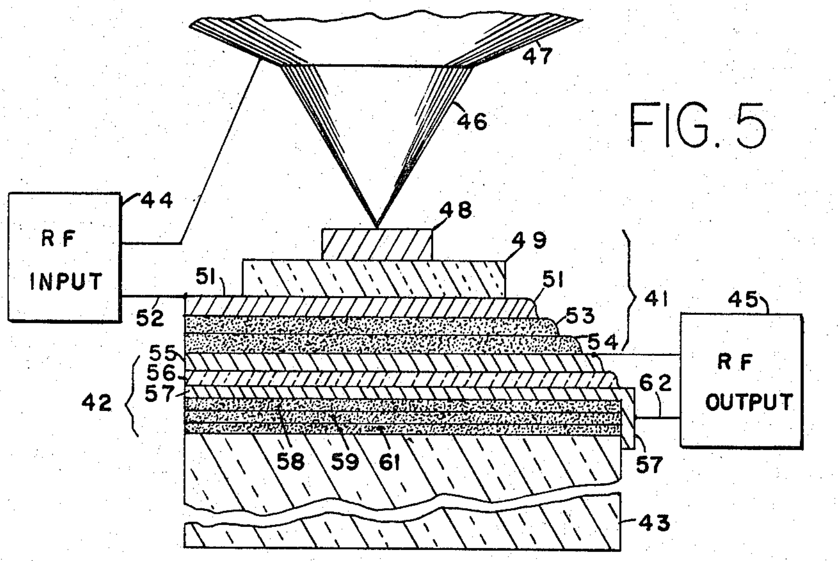
FIGURE 5 shows cascaded resonators constructed in accordance with the invention to provide a high frequency electric wave filter of small dimensions.

An RF filter structure incorporating features of the invention is illustrated in FIG. 5. The filter includes two or more resonators 41 or 42 in acoustical series supported by a substrate 43. The resonators are connected so that acoustical wave energy flows from the input resonator 41 to the output resonator 42. Accordingly, the abutting ends of each of these resonators partially transmit and partially reflect the acoustic wave energy.

An electrical RF input signal from a source 44 is applied across the input resonator 41 and the filtered electrical RF output 45 is taken from across the output resonator 42.

The input resonator 41 is similar to the oscillators described above insofar as a point 46 at the end of a bellows 47 touches the electrically conductive film 48 laid down on the active film 49 of piezoelectric semiconductor material. The conductive film 48 serves in conjunction with another conductive film 51 beneath the film 49 to bound the RF field imposed on the material in film 49. Input RF signals are applied from the source 44 preferably by coupling to the film 49 via a transmission line 52 matched to the electrical impedance of resonator 41, and connected to films 48 and 51.

The film 49 is preferably $(n+1)\lambda/2$ in thickness. The conductive films 48 and 51 and a plurality of films such as 53 and 54 below film 51 are each preferably between $(n+1)\lambda/2$ and $(2n+1)\lambda/4$ in thickness and are alternately of relatively high and relatively low characteristic acoustical impedance so that these films (51, 53 and 54) partially reflect and partially transmit acoustic wave energy of wavelength $\lambda$ generated in the piezoelectric film 49.

The acoustic energy transmitted through the films 51, 53 and 54 enters resonator 42 through the electrically conductive film 55 immediately adjacent the films 53 and 54 and generate electrical waves in the passive piezoelectric semiconductor film 56 sandwiched between conductive films 55 and 57. The acoustic waves which enter the passive piezoelectric film 56 resonate therein by virtue of partial transmission from the half wavelength layers (55, 54, 53 and 51) above and substantially total reflection from the odd quarter wave layers 57, 58, 59 and 61 [$(2n+1)\lambda/4$ in thickness] below. Thus, an RF electric signal is produced across the conductive films 55 and 57 which couple to an output transmission line 62 leading to the RF output.

The input RF electrical signal is filtered by virtue of the different acoustical frequency-amplitude characteristics of the resonators 41 and 42. The extent to which these characteristics of the resonators overlap substantially determines the electrical characteristics of the filter. More than two such resonators may be cascaded, as shown, to provide a great variety of filters with characteristics tailored for particlar uses.

This completes description of a number of embodiments of the present invention of a thin film piezoelectric resonator including a resonant acoustic cavity useful to provide an RF filter or an RF oscillator by virtue of positive feedback therein which sustains oscillations. While substantial detail of a number of the embodiments is included, these details are not to be construed as limitations of the invention as set forth in the accompanying claims.

What is claimed is:

1. An oscillator comprising,
an epitaxial film having both piezoelectric and semiconductor qualities,
means for producing a DC electric field in said film of sufficient magnitude to generate high frequency electrical and acoustic waves therein,
said electrical and acoustic waves exchanging energy in said film,
means for providing positive feedback for the acoustic waves, and
means for coupling high frequency energy from said film to utilization device.

2. An oscillator as in claim 1 and in which,
said means for providing positive feedback defines an acoustic cavity,
enclosing at least a portion of said film,
resonant at the frequency of said acoustic waves, and
thereby providing positive feedback of said acoustic waves within said film.

3. An oscillator as in claim 1 and in which,
the direction of said DC electric field in said film is along the axis of said acoustic cavity.

4. An oscillator as in claim 1 and in which,
the crystalline axes of said epitaxial film are such that said high frequency acoustic waves are in the longitudal mode.

5. An oscillator as in claim 1 and in which,
the crystalline axes of said epitaxial film are such that said high frequency acoustic waves are in the shear mode.

6. An oscillator as in claim 3 and in which,
the opposite sides of said film have acoustically reflective material contiguous therewith which
form acoustically reflective interfaces therewith, and define said acoustic cavity.

7. An oscillator as in claim 6 and in which,
said contiguous material is relatively reflective to acoustical energy.

8. An oscillator as in claim 7 and in which,
said acoustically reflective material comprises a plurality of layers forming acoustically reflective interfaces therebetween.

9. An oscillator as in claim 6 and in which,
the thickness of said film is substantially an integral number of one half wavelengths of said acoustic wave.

10. An oscillator as in claim 8 and in which,
the thickness of each of said plurality of layers is substantially an odd number of quarter wavelengths of said acoustic waves.

11. An oscillator as in claim 10 and in which,
the characteristic acoustic impedance of said materials forming said layers is altrenately relatively low and relatively high.

12. An oscillator as in claim 8 and in which,
one of said layers is electrically conductive and bounds one end of said DC electric field.

13. An oscillator comprising,
an epitaxial film having both piezoelectric and semiconductor qualities, means for relecting acoustic waves and for defining an acoustic cavity, said last mentioned means containing said film, and said cavity being resonant at a predetermined acoustic wave frequency, means including a DC bias source for establishing a DC electric field transverse to said film, said field having a magnitude and direction such that the drift velocity of the carriers in said film responsive to said field has a velocity component along the axis of said acoustic cavity which is greater than the velocity of the acoustic waves along said cavity axis, and whereby said carriers exchange energy with said acoustic waves along said axis amplifying said acoustic waves, and means for coupling electrical wave energy from said cavity.

References Cited

UNITED STATES PATENTS

| | | | |
|---|---|---|---|
| Re. 26,091 | 9/1966 | White | 330—5.5 X |
| 3,240,962 | 3/1966 | White | 333—72 X |
| 3,325,748 | 6/1967 | Crabbe | 331—107 |

ROY LAKE, *Primary Examiner.*

S. H. GRIMM, *Assistant Examiner.*

U.S. Cl. X.R.

331—158; 330—5.5; 333—72; 307—298; 310—8.2, 9.4